US011536402B2

(12) United States Patent
Franz et al.

(10) Patent No.: US 11,536,402 B2
(45) Date of Patent: Dec. 27, 2022

(54) SWIVEL-CAPABLE, LOW-PRESSURE-DROP HOSE BARB FITTINGS

(71) Applicant: HEWLETT PACKARD ENTERPRISE DEVELOPMENT LP, Houston, TX (US)

(72) Inventors: John Franz, Houston, TX (US); Tahir Cader, Liberty Lake, WA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 549 days.

(21) Appl. No.: 16/579,254

(22) Filed: Sep. 23, 2019

(65) Prior Publication Data
US 2021/0033226 A1    Feb. 4, 2021

Related U.S. Application Data

(60) Provisional application No. 62/880,772, filed on Jul. 31, 2019.

(51) Int. Cl.
| | | |
|---|---|---|
| *F16L 21/035* | (2006.01) | |
| *F16L 21/03* | (2006.01) | |
| *H05K 7/20* | (2006.01) | |

(52) U.S. Cl.
CPC ............. *F16L 21/03* (2013.01); *F16L 21/035* (2013.01); *H05K 7/20772* (2013.01)

(58) Field of Classification Search
CPC . F16L 17/00; F16L 17/06; F16L 21/02; F16L 21/035; F16L 21/04; F16L 37/08;
(Continued)

(56) References Cited

U.S. PATENT DOCUMENTS

| 4,714,558 A | 12/1987 | Barbee et al. |
|---|---|---|
| 5,419,594 A | 5/1995 | Nelms |

(Continued)

FOREIGN PATENT DOCUMENTS

| GB | 2566689 A | 3/2019 |
|---|---|---|
| WO | WO-2019053439 A2 | 3/2019 |
| WO | WO-2019071059 A1 | 4/2019 |

OTHER PUBLICATIONS

Sidewindercomputers, "Bitspower Shining Silver Rotary 90 Fitting # BP-LRII—G 1/4 Threads," 2019, 1-Page, Retrieved from the Internet on Jul. 16, 2019 at URL: <sidewindercomputers.com/bishsiro90fi1.html>.

*Primary Examiner* — Aaron M Dunwoody
(74) *Attorney, Agent, or Firm* — Hewlett Packard Enterprise Patent Department

(57) ABSTRACT

Hose barb fittings and apparatuses described herein provide increased fluid-flow rates for cooling loops used for thermal control in computer system. A hose barb fitting comprises a fluid-flow passage that extends through the hose barb fitting from a first opening to a second opening. The ratio of the cross-sectional area of the fluid-flow passage to the cross-sectional area of the hose barb fitting is between 0.4 and 0.7, inclusive. When the hose barb fitting is fully seated within a housing structure, a specialized gasket acts as both a radial seal and a face seal. Also, a flange extending from the housing structure engages with a flange extending from the hose barb fitting to prevent the hose barb fitting from being unseated.

20 Claims, 8 Drawing Sheets

(58) Field of Classification Search
CPC ....... F16L 37/24; F16L 37/244; F16L 37/248; F16L 37/252; F16L 47/06; F16L 47/065; F16L 47/08; F16L 47/10; F16L 47/12
USPC .................................. 285/347, 374, 376, 95
See application file for complete search history.

(56) References Cited

U.S. PATENT DOCUMENTS

| | | |
|---|---|---|
| 6,439,620 B1 * | 8/2002 | Guest ..................... F16L 33/18 |
| | | 285/239 |
| 6,962,625 B2 | 11/2005 | Bredesen |
| 6,988,518 B2 | 1/2006 | Rackers |
| 6,989,990 B2 | 1/2006 | Malone et al. |
| 7,020,997 B1 | 4/2006 | Thomas |
| 7,354,307 B2 | 4/2008 | Chee et al. |
| 7,635,010 B1 | 12/2009 | Manno et al. |
| 7,811,278 B2 | 10/2010 | Knipple, Jr. et al. |
| 10,111,364 B2 | 10/2018 | Arvelo et al. |
| 2013/0312846 A1 | 11/2013 | Eriksen et al. |
| 2015/0135588 A1 | 5/2015 | Gergek |
| 2017/0064911 A1 | 3/2017 | Trujillo |

* cited by examiner

SWIVEL-CAPABLE, LOW-PRESSURE-DROP HOSE BARB FITTINGS

RELATED APPLICATIONS

This application claims priority to U.S. provisional application No. 62/880,772 ("Swivel-capable, Low-pressure-drop hose barb fittings" by John Franz and Tahir Cader), filed on Jul. 31, 2019, which is hereby incorporated by reference in its entirety.

BACKGROUND

Modern servers and other computing systems can generate a substantial amount of heat during operation. Such computing systems include cooling mechanisms to protect electronic components (e.g., processors) from being damaged by elevated temperatures. For example, some air-cooled computing systems include heat sinks that are thermally coupled to processors via thermal paste. A fan may be used to ensure that the air surrounding the heat sink flows properly. Similarly, liquid-cooled systems may include cold plates that facilitate heat dissipation from electronic components into a liquid. A pump or some other mechanism may be used to circulate the liquid to ensure that heat is transported away from electronic components that generate that heat. Regardless of whether the fluid used to dissipate heat is a liquid or a gas, computer-cooling mechanisms provide the thermal control that allows modern computing systems to operate for hours, days, weeks, or months at a time without suffering from temperature-related breakdown.

BRIEF DESCRIPTION OF THE DRAWINGS

Various features and advantages will become apparent from the following description, given by way of example only, which is made with reference to the accompanying drawings, of which.

DETAILED DESCRIPTION

Figure 1:
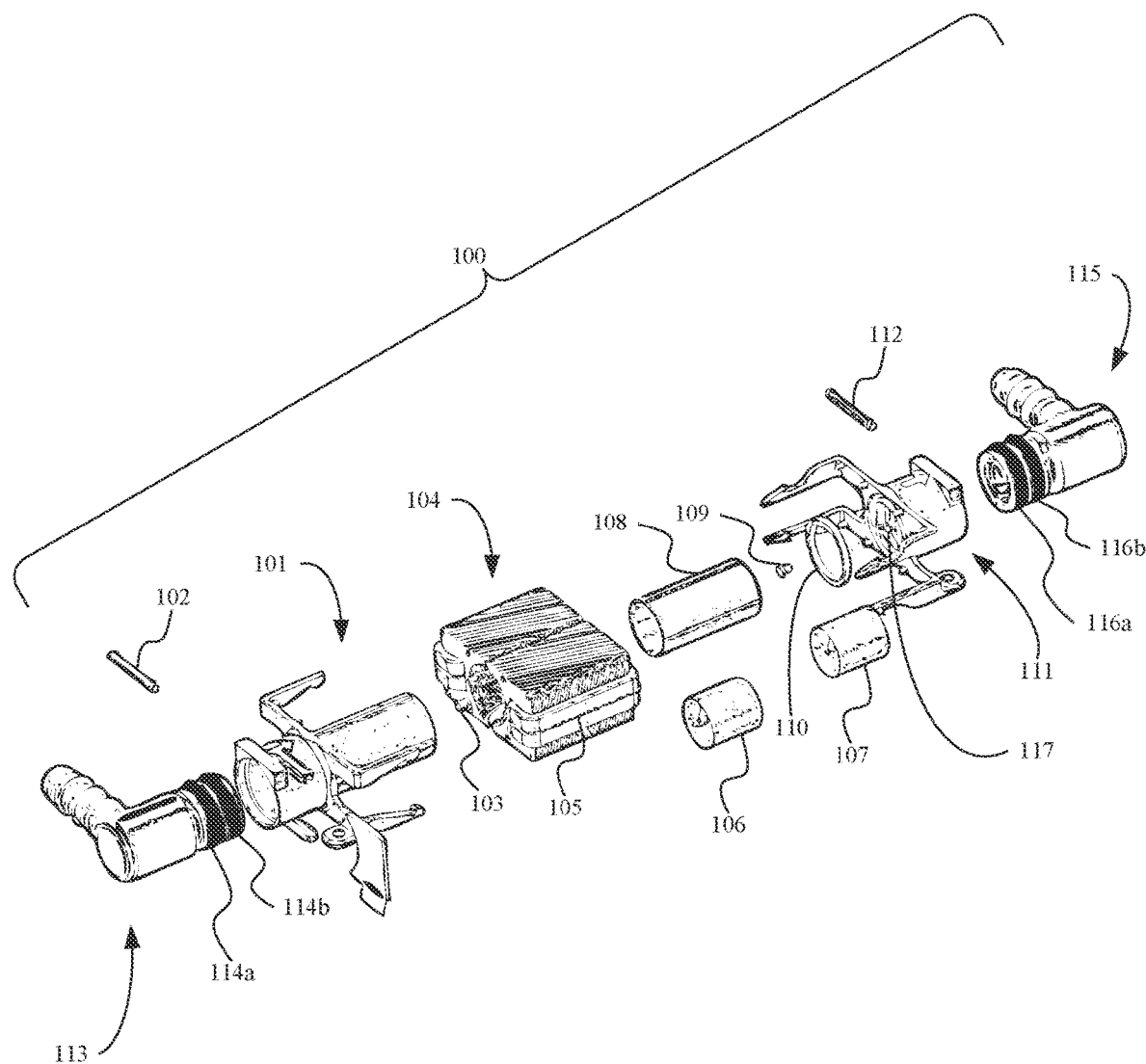
FIG. 1 is an exploded perspective view of a micro-axial pump that is configured to be connected to a cooling loop by hose barb fittings that use O-rings, according to one example.

As the speed, processing capacity, and other aspects of industrial servers used in high-performance computing (HPC) increase, the power consumed and the heat generated by these industrial servers also tends to increase. In particular, some serviceable blade server units may consume power at a rate of 5,000-6,000 watts (W) or more. For a liquid-based thermal control mechanism to cool various components of these servers using warm water (e.g., 32 degrees Celsius or higher), and to prevent excessive device temperatures, the flow rate of a cooling fluid through the server may be as high as 2.5 gallons per minute (gpm).

There are a variety of hose connections that may be used in the industry to link cold plates with cooling loops in liquid-based thermal control mechanisms for servers. Some hose barb fittings can be swiveled to prevent excessive stress when hoses are manipulated during installation or service, yet remain fully seated while being swiveled. One problem, however, is that hose barb fittings that can be swiveled use O-rings to achieve the seal that prevents the liquid from leaking from the joints where these fittings are installed. The dimensions of the recesses in which the O-rings are seated constrain the size of the fluid-flow passage through which the cooling liquid passes, thereby constricting the flow. In addition, current design practices limit coolant flow rates to a range of 7-10 feet per second (ft/s) (depending on the materials used) in order to limit pressure drop (and thereby keep pumping power low) and prevent material erosion. Specifically, where plastic hose barb fittings subject to existing constraints on internal diameters are used, the coolant flow rate may be constrained to 7 ft/s to mitigate erosion.

These constraints on coolant flow rates conflict with the increasing coolant flow rates for the thermal control mechanisms in industrial HPC servers. A constraint on a coolant flow rate may ultimately result in a constraint on the overall cooling capacity, which is not desirable in a field where the demands placed on cooling mechanisms are expected to increase. Furthermore, the constrictions caused by O-ring-based seals result in high pressure drops which directly impact the amount of power that coolant pumps consume.

Hose barb fittings and apparatuses described herein can be used in conjunction with distributed high performance axial micro pumps to address the problems discussed above. The pumps are described in greater detail in U.S. patent application Ser. No. 16/215,498, entitled "Axial flow pump with reduced height dimension," which is hereby incorporated by reference in its entirety. As explained in further detail below, the hose barb fittings and apparatuses described herein enlarge coolant flow passages, allow hoses with increased diameters to be used, reduce pressure drops and erosion, and facilitate greater efficiency and longevity in liquid-cooling systems. Furthermore, gaskets described herein provide a seal that is superior to the seal achieved by existing O-rings, yet still allow fully seated hose barb fittings to be swiveled without compromising the strength of the seal. Also, the hose barb fittings and apparatuses described herein obviate the need for the barb-retaining pins used to secure, for example, an existing and widely deployed hose barb fitting. Since no retaining pins are unnecessary, the hose barb fittings described herein can be inserted quickly—and without requiring the use of any tools. In addition, the hose barb fittings described herein achieve these advantages without requiring additional axial length or a larger outer diameter than existing hose barb fittings.

FIG. 1 is an exploded perspective view of a micro-axial pump 100 that is configured to be connected to a cooling loop by hose barb fittings that use O-rings, according to one example. As shown, the micro-axial pump 100 includes an inlet housing structure 101, a first barb-retaining pin 102, an axial bushing/bearing 103, a motor lamination stack 104, a bobbin wire holder 105, a first impeller 106, a second impeller 107, a magnet 108, an axial bushing 109, a housing gasket seal 110, an exit housing structure 111, and a second barb-retaining pin 112. The exit housing structure 111 also includes a mount 117 comprising an aperture for the axial bushing 109 and three radial supports. A first hose barb fitting 113 includes O-ring 114a and O-ring 114b, while a second hose barb fitting 115 includes O-ring 116a and O-ring 116b.

Figure 2:
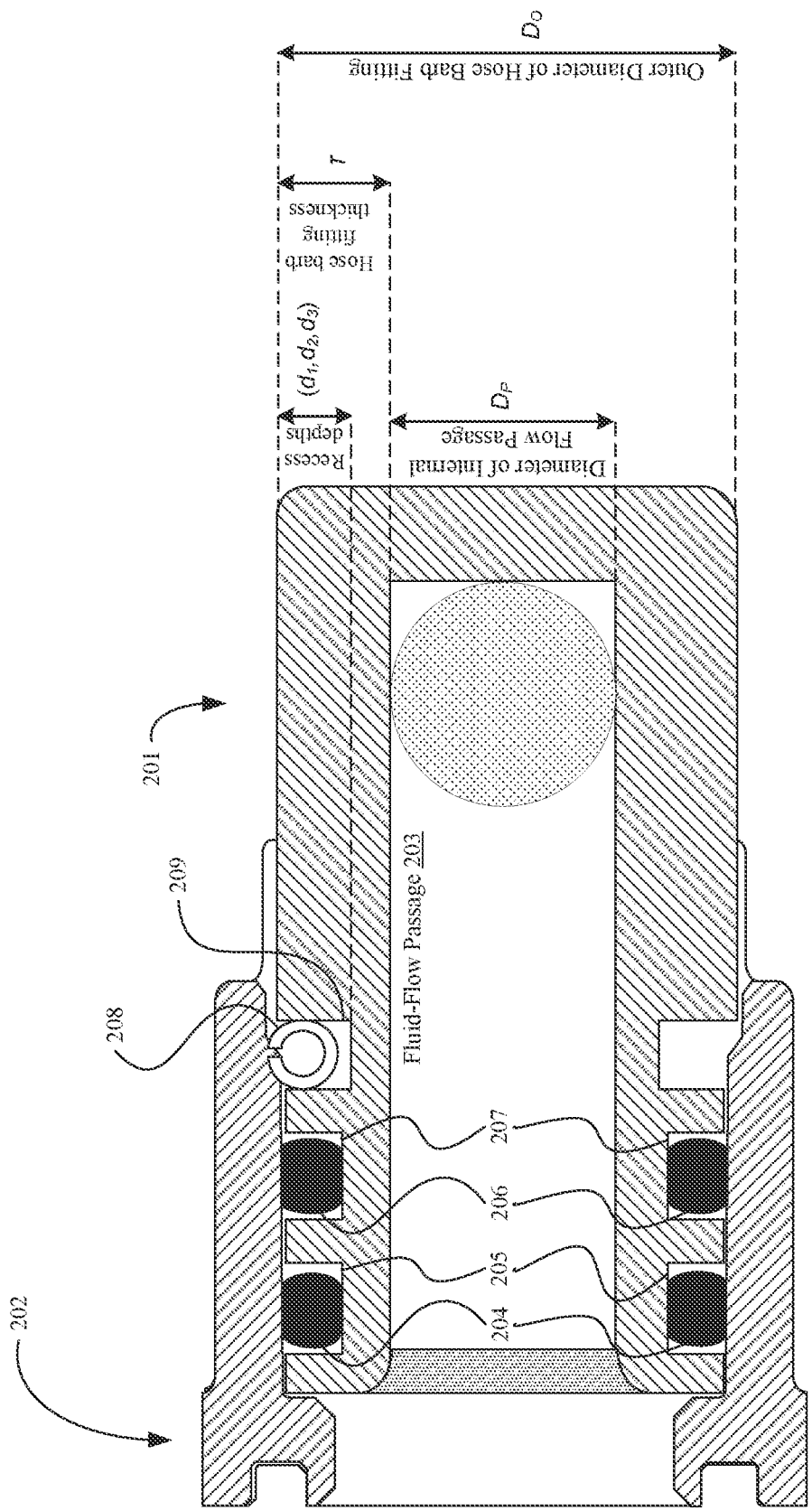
FIG. 2 provides a cutaway partial view of a hose barb fitting in a fully seated position within a housing structure, according to one example.

FIG. 2 provides a cutaway partial view of a hose barb fitting 201 in a fully seated position within a housing structure 202, according to one example. Note that the housing structure 202 may include additional features not shown in FIG. 2, such as a mount for an axial bushing (e.g., similar to the mount 117 shown in FIG. 1).

As shown, a fluid-flow passage 203 extends through the hose barb fitting 201. The O-ring 204 rests in the recess 205 on the outer surface of the hose barb fitting 201. Similarly, the O-ring 206 rests in the recess 207 on the outer surface of the hose barb fitting 201. The O-ring 204 and the O-ring 206 presses against the inner surface of a socket within the housing structure 202, thereby resulting in a seal.

In addition, the pin 208 is inserted through an aperture in the housing structure 202. The pin 208 engages with the recess 209 on the outer surface of the hose barb fitting 201 to prevent the hose barb fitting 201 from being removed from the housing structure 202 when the hose barb fitting 201 is fully seated within the housing structure 202.

The depth of the recess 205, the recess 207, and the recess 209 constrains the diameter of the fluid-flow passage 203. Specifically, let the depth of the recess 205 be represented by $d_1$, the depth of the recess 207 be represented by $d_2$, and the depth of the recess 209 be represented by $d_3$. Also let $D_o$ represent the outer diameter of the hose barb fitting 201, $D_p$ represent the diameter of the fluid-flow passage 203, and $\tau$ represent the thickness of the hose barb fitting 201 (which is presumably non-zero) at the deepest of the recesses 205, 207, 209. The constraint on the diameter of the fluid-flow passage 203 can be represented by the following equation:

$$D_P \leq D_O - 2 \cdot [\tau + \max(d_1, d_2, d_3)]$$

where "max" refers to the max function. In one example, suppose the outer diameter of the hose barb fitting 201 cannot be increased (e.g., due to space constraints in an environment where the hose barb fitting 201 is designed to be used), the thickness of the O-rings 204, 206 cannot be reduced without compromising the integrity of the seal, and if the thickness of the pin 208 cannot be reduced without compromising the functionality of the pin 208. In this example, there would not be a way to increase the diameter of the fluid-flow passage 203 without negatively affecting the intended functionality of the hose barb fitting 201.

Figure 3:
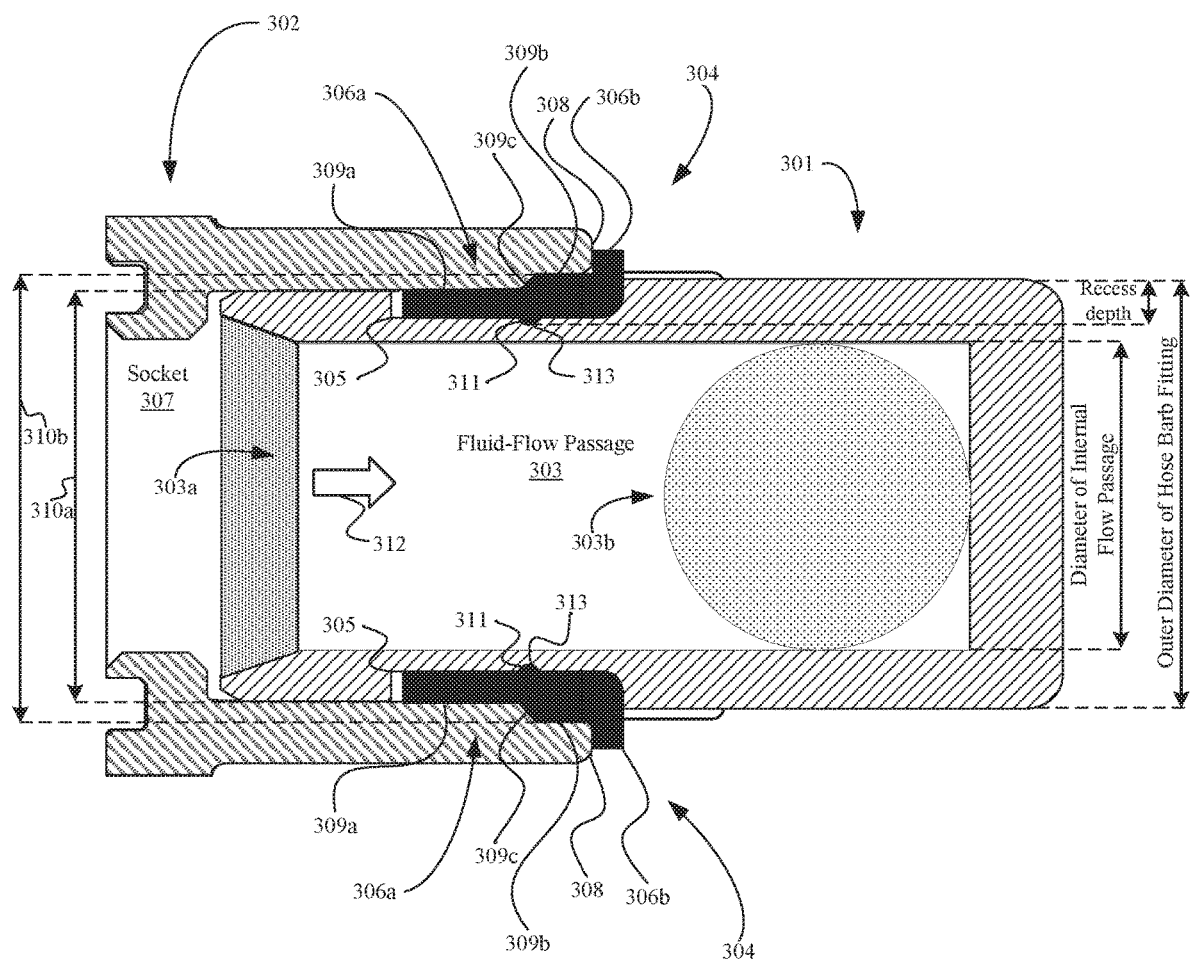
FIG. 3 provides a cutaway partial view of a hose barb fitting that provides advantages described herein over the hose barb fitting shown in FIG. 2, according to one example.

FIG. 3 provides a cutaway partial view of a hose barb fitting 301 that provides advantages described herein over the hose barb fitting 201 shown in FIG. 2, according to one example. The hose barb fitting 301 is shown in a fully seated position within a socket 307 found in the housing structure 302. Again, note that the housing structure 302 may include additional features not shown in FIG. 3, such as a mount for an axial bushing (e.g., similar to the mount 117 shown in FIG. 1). A fluid-flow passage 303 extends through the hose barb fitting 301 from a first opening 303a to a second opening 303b. The gasket 304 rests in the recess 305 on the outer surface of the hose barb fitting 301.

The gasket 304 acts as both a radial seal and a face seal. Specifically, an anterior portion 306a of the gasket 304 rests within the socket 307 of the housing structure 302 and presses against the inner surface of the socket 307, thereby resulting in a radial seal. In addition, a posterior portion 306b of the gasket 304 rests outside of the socket 307 and presses against an outer surface 308 of the housing structure 302, thereby resulting in a face seal (i.e., an axial seal).

The anterior portion 306a of the gasket 304 includes a first section 309a, a second section 309b, and a third section 309c. As shown, the outer diameter 310a of the first section 309a is smaller than the outer diameter 310b of the second section 309b. Also, as shown, the outer surface of the third section 309c is chamfered to transition from the outer diameter 310a to the outer diameter 310b. A corresponding section of the socket 307 is also chamfered to fit the outer surface of the third section 309c snugly.

The inner surface of the third section 309c includes a protuberance 311 that extends radially inward relative to the fluid-flow direction 312 for the first opening 303a. The protuberance 311 rests in an indentation 313 found in the recess 305. In one example, the protuberance 311 may extend across the entire circumference of the inner surface of the gasket 304. In other examples, the protuberance 311 may extend across less than the entire circumference of the inner surface of the gasket 304. Also, annular bumps and grooves may be added to the inner surface or the outer surface of the gasket 304 to facilitate flexibility and improve seal strength.

The hose barb fitting 301 can be swiveled about an axis parallel to the fluid-flow direction 312 while fully seated. However, no pin is necessary to prevent the hose barb fitting 301 from becoming unseated (e.g., due to features shown and described in FIG. 4). Therefore, in some examples, the housing structure 302 does not include an aperture configured to have a pin inserted therein.

Since a pin is unnecessary to keep the hose barb fitting 301 fully seated, no recess is needed in the hose barb fitting 301 to accommodate such a pin. Furthermore, since the gasket 304 serves as a seal, no O-rings are necessary. Thus, no recess is needed in the hose barb fitting 301 to accommodate any O-rings. Instead, the hose barb fitting 301 includes the recess 305 to accommodate the gasket 304. The gasket 304 is longer in the fluid-flow direction 312 than an O-ring, so the length of the recess 305 is longer in the fluid-flow direction 312 than a recess for an O-ring. In one example, the ratio of the length of the recess 305 in the fluid-flow direction 312 to the cross-sectional width (e.g., diameter) of the fluid-flow passage 303 is between 0.5 and 0.9, inclusive. In another example, the ratio of the length of the recess 305 in the fluid-flow direction 312 to the cross-sectional width (e.g., diameter) of the fluid-flow passage 303 is between 0.6 and 0.8, inclusive.

On the other hand, since the radial thickness of the gasket 305 is less than the radial thickness of O-rings (e.g., O-rings 204, 206 shown in FIG. 2), the recess 305 can be more shallow than recesses used for O-rings or pins (e.g., recesses 205, 207, 209 shown in FIG. 2). As a result, the cross-sectional width (e.g., diameter) of the fluid-flow passage 303 can be larger than would be possible if O-rings or a pin were used.

The increased width results in a greater cross-sectional area through which coolant can flow in the fluid-flow passage 303. In one example, the ratio of the cross-sectional area of the fluid-flow passage 303 in a plane orthogonal to the fluid-flow direction 312 to the cross-sectional area of the hose barb fitting 301 in that same plane is between 0.4 and 0.7, inclusive. In another example, the ratio of the cross-sectional area of the fluid-flow passage 303 in a plane orthogonal to the fluid-flow direction 312 to the cross-sectional area of the hose barb fitting 301 in that same plane is between 0.5 and 0.6, inclusive. Note that the cross-sectional area of the hose barb fitting 301 in the plane includes the cross-sectional area of the fluid-flow passage 303 and any additional area enclosed by the cross-sectional perimeter of the hose barb fitting 301 in the plane.

Figure 4A:
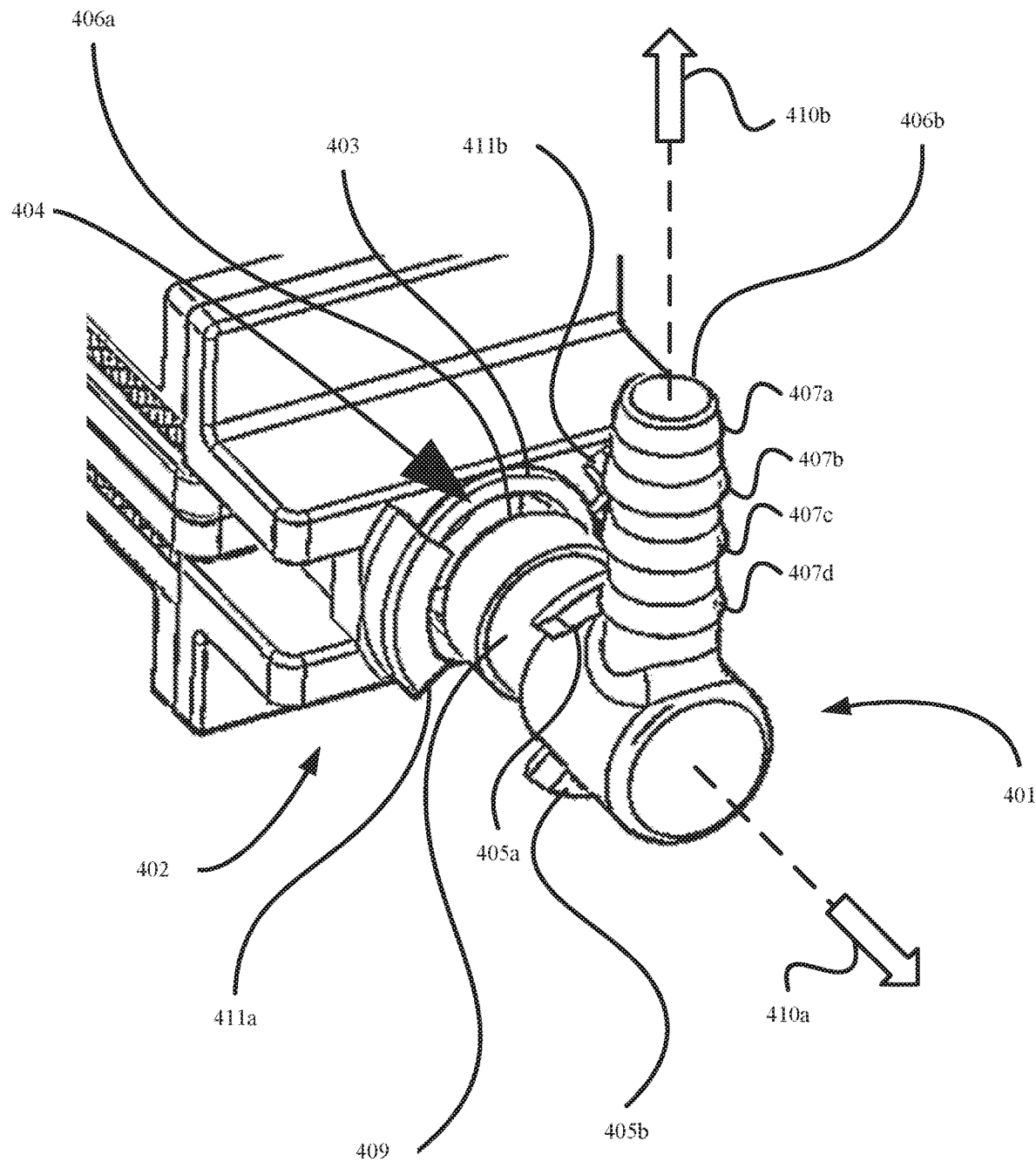
FIGS. 4a-c illustrate a sequence of perspective views of a hose barb fitting being inserted into a housing structure and swiveled into a fully seated orientation, according to one example.
Figure 4B:
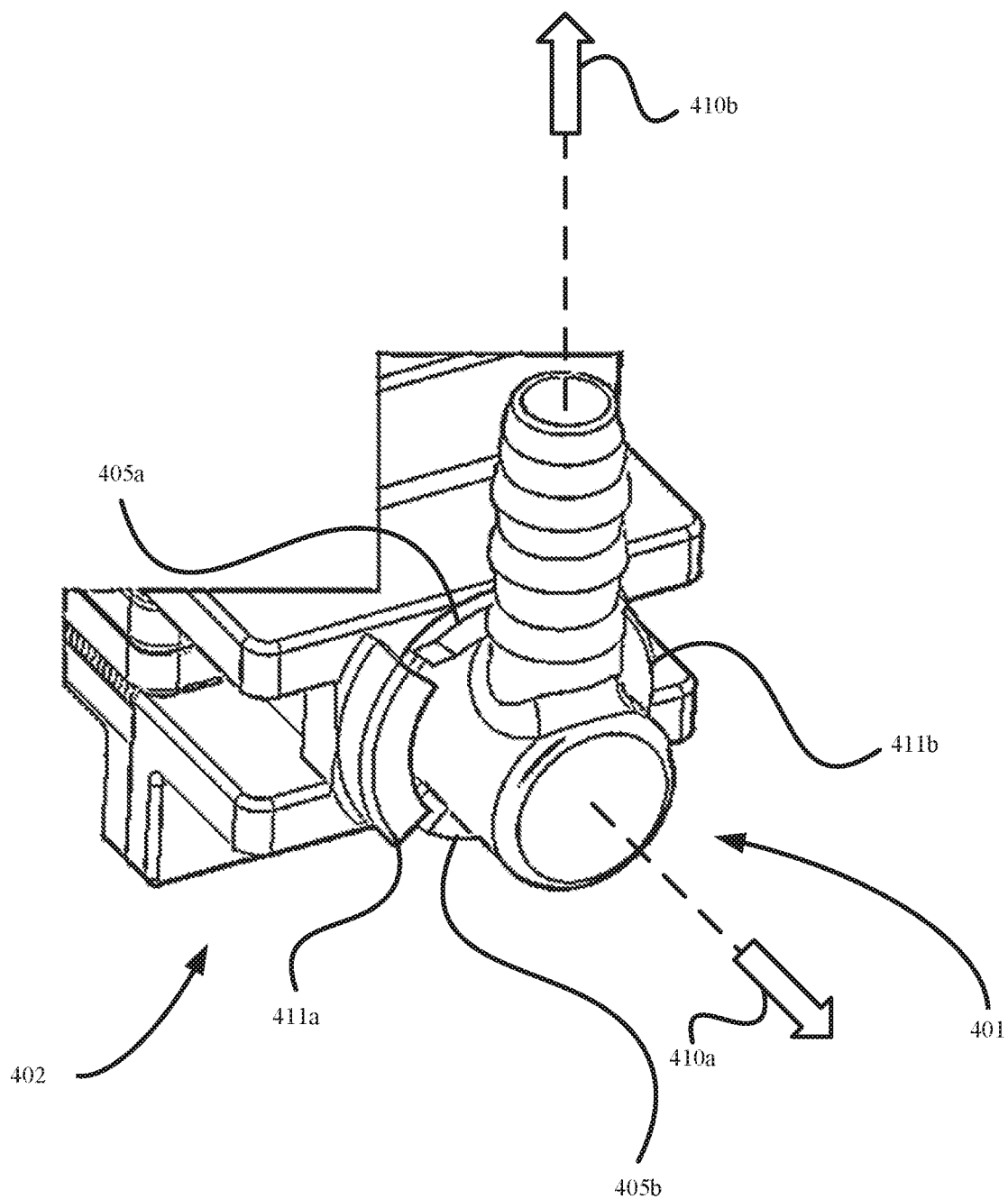
Figure 4C:
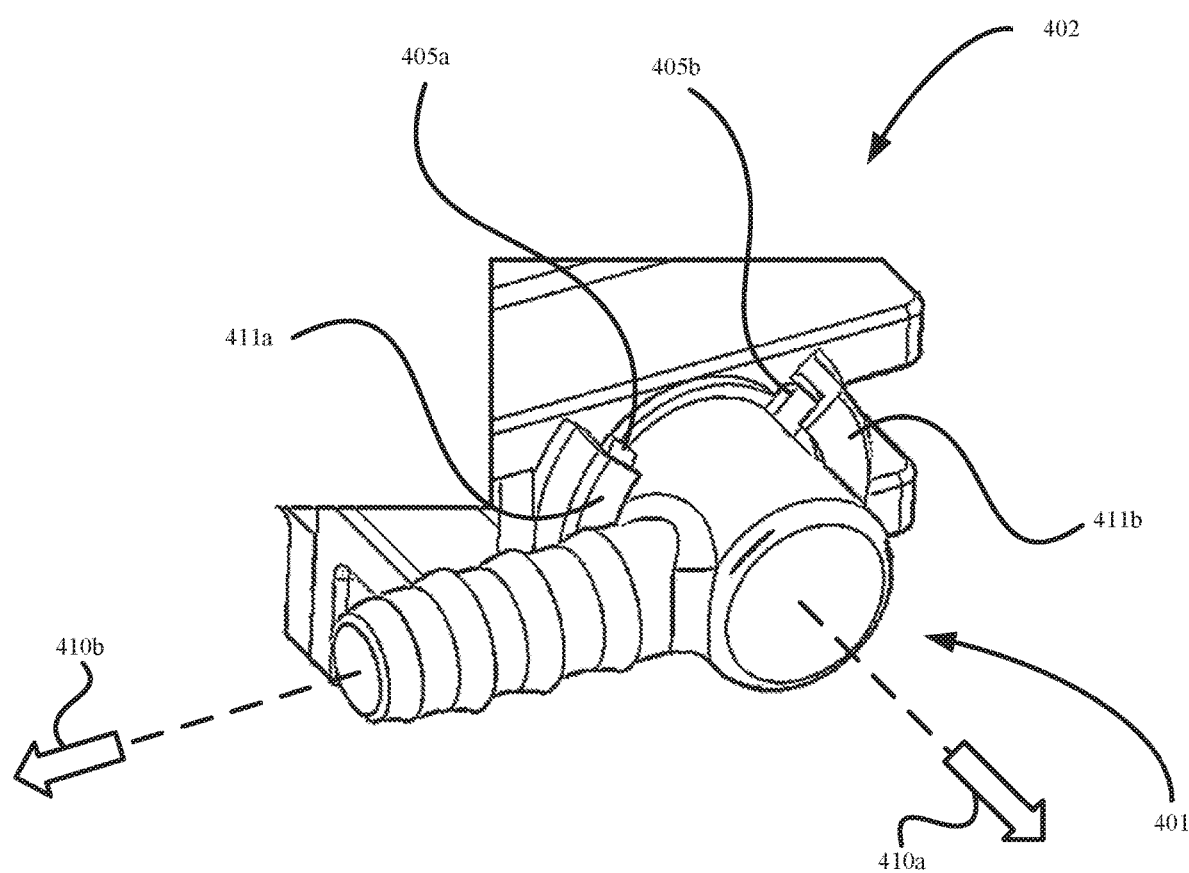

FIGS. 4a-c illustrate a sequence of perspective views of a hose barb fitting 401 being inserted into a housing structure 402 and swiveled into a fully seated orientation, according to one example.

In FIG. 4a, the hose barb fitting 401 is shown outside of the housing structure 402. The gasket 403 is visible inside the socket 404 of the housing structure 402. The flanges 405a-b are proximal to the first end 406a of the hose barb fitting 401, while the barbs 407a-d are proximal to the second end 406b of the hose barb fitting 401. The flanges 405a-b extend outward from the outer surface of the hose barb fitting 401. Similarly, the barbs 407a-d also extend outward from the outer surface of the hose barb fitting 401. The flanges 405a-b are positioned on opposite sides of the outer surface of the hose barb fitting 401.

As shown, a recess 409 extends along the cross-sectional outer perimeter of the hose barb fitting 401 (e.g., along the circumference of the hose barb fitting 401 in a plane orthogonal to the fluid-flow direction 410a for the opening at the first end 406a). The recess 409 is configured to hold the gasket 403 when the hose barb fitting is seated inside the socket 404 (e.g., as shown below in FIG. 4c). In this example, the fluid-flow direction 410a for the opening at the first end 406a is offset from the fluid-flow direction 410b for the opening at the second end 406b by ninety degrees. However, in other examples, the offset angle may be acute (e.g., between zero degrees and 90 degrees), obtuse (e.g., between 90 degrees and 180 degrees), or straight (e.g., zero degrees or 180 degrees).

In addition, the housing structure 402 includes flanges 411a-b. As shown, an axial section of the flange 411a extends axially relative to the fluid-flow direction 410a, while a radial section of the flange 411a extends radially inward relative to the fluid-flow direction 410a. Flange 411b is structured similarly. When the hose barb fitting 401 is moved in the direction opposite the fluid-flow direction 410a, the view shown in FIG. 4b results.

In FIG. 4b, the first end 406a of the hose barb fitting 401 is positioned inside the socket 404 such that the first end 406a and the socket 404 are no longer visible from the perspective shown. In addition, the flanges 405a-b are now positioned such that a cross-sectional plane orthogonal to the fluid-flow direction 410a that passes through the flanges 405a-b also passes through the axial sections of the flanges 411a-b. When the hose barb fitting 401 is rotated about an axis parallel to the fluid-flow direction 410a, the view shown in FIG. 4c results.

In FIG. 4c, the hose barb fitting 401 is shown in a fully seated position within the housing structure 402. As shown, the flange 405a and the flange 405b engage with the flange 411a and the flange 411b, respectively, to prevent the hose barb fitting 401 from exiting the socket 404 and to provide a compression force for the seal provided by the gasket 405. Note that the flanges 405a-b will still engage with the flanges 411a-b in this manner if barb fitting 401 is swiveled about an axis parallel to the fluid-flow direction 410a into any orientation in which a portion of the radial sections of the flanges 411a-b overlays a portion of the flanges 405a-b relative to the fluid-flow direction 410a.

Figure 5A:
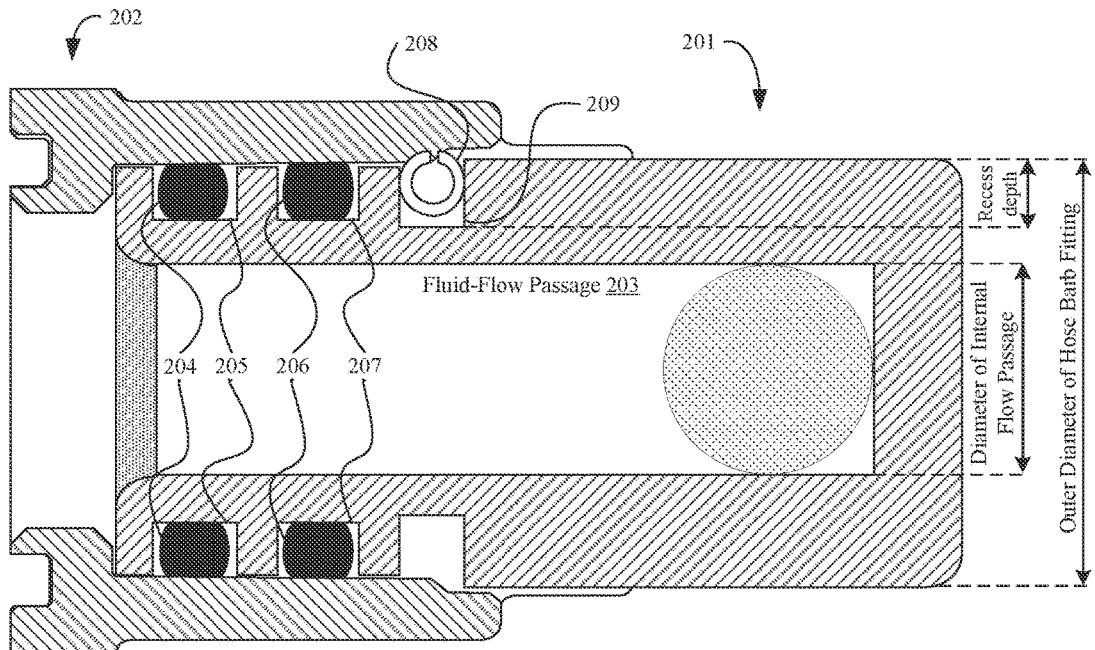
FIGS. 5a-b provide the cutaway partial views shown in FIGS. 2-3 side by side for dimensional comparison to illustrate some advantages provided by the hose barb fitting 301, according to one example.
Figure 5B:
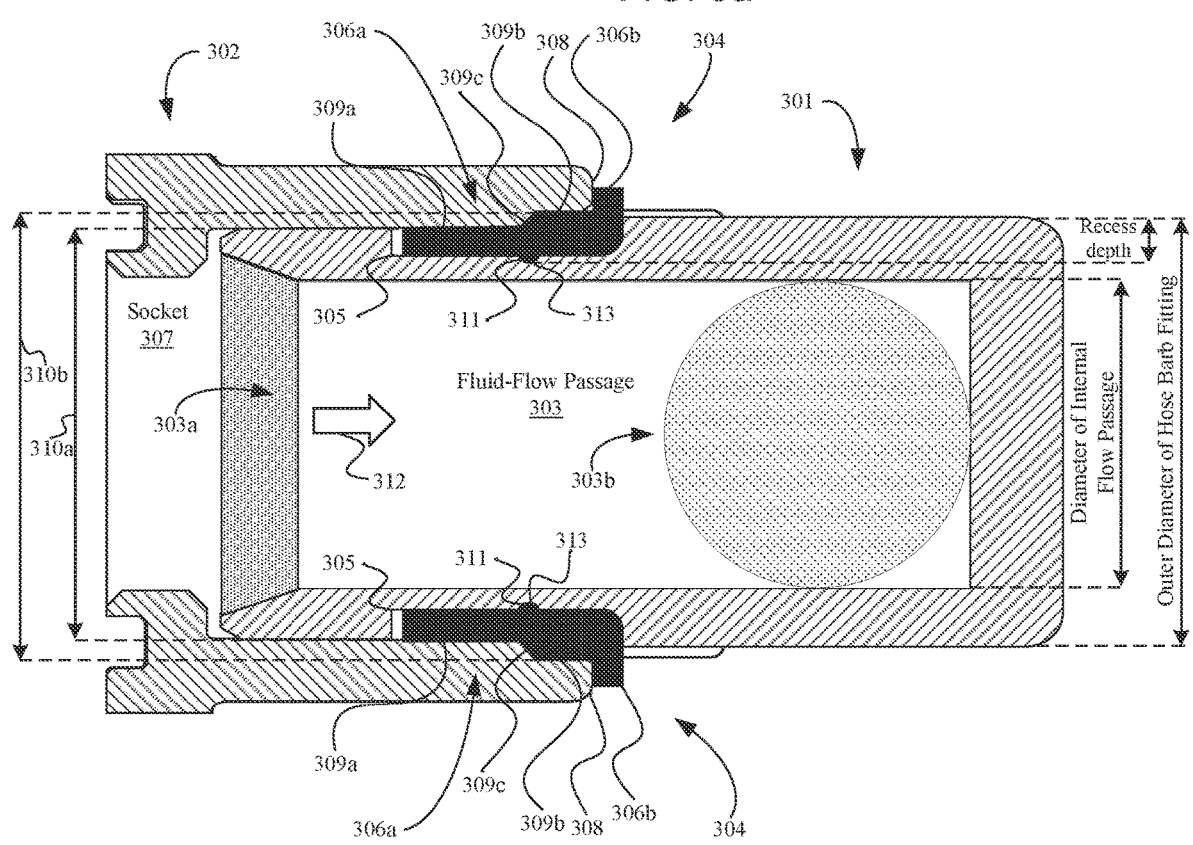

FIGS. 5a-b provide the cutaway partial views shown in FIGS. 2-3 side by side for dimensional comparison to illustrate some advantages provided by the hose barb fitting 301, according to one example. As explained above with respect to FIG. 2, the depth of the recesses 205, 207, 209 constrains the diameter of the fluid-flow passage 203. By contrast, the recess 305 is shallow enough to allow the fluid-flow passage 303 to have a larger diameter than the fluid-flow passage 203.

In one example, suppose the outer diameter of the hose barb fitting is equal to the outer diameter of the hose barb fitting 301. Also suppose that diameter of the fluid-flow passage 203 is 5.5 millimeters. In this example, the diameter of the fluid-flow passage 303 could be as large as nine millimeters. The cross-sectional area of the fluid-flow passage 203 in a plane orthogonal to the fluid-flow direction 312 would be $\pi \cdot [5.5/2]^2$ millimeters squared (mm$^2$), which is about 23.8 mm$^2$. By contrast, the cross-sectional area of the fluid-flow passage 303 in a plane orthogonal to the fluid-flow direction 312 would be $\pi \cdot [9/2]^2$ millimeters squared (mm$^2$), which is about 63.6 mm$^2$. Thus, the cross-sectional area of the fluid-flow passage 303 is nearly three times the cross-sectional area of the fluid-flow passage 203.

The difference can further be quantified by considering the effect of this increased cross-sectional area on the flow rates that can be achieved via the hose barb fitting 301. Suppose seven feet per second (7 ft/s) is the target flow velocity for a cooling loop. In this example, the 23.8 mm$^2$ cross-sectional area of the fluid-flow passage 203 would facilitate a flow rate of 0.6 gallons per minute (gpm). By contrast, the 63.6 mm$^2$ cross-sectional area of the fluid-flow passage 303 would facilitate a flow rate of 1.75 gallons per minute. Thus, the fluid-flow passage 303 allows a flow rate that is nearly three times the flow rate allowed by the fluid-flow passage 203 at a flow velocity of 7 ft/s. In this example, the flow rate of 0.6 gpm could be used to cool a computing system that consumes power at a rate of about 2,800 watts. The flow rate of 1.75 gpm could be used to cool a computing system that consumes power at a rate of about 8,200 watts.

Figure 6:
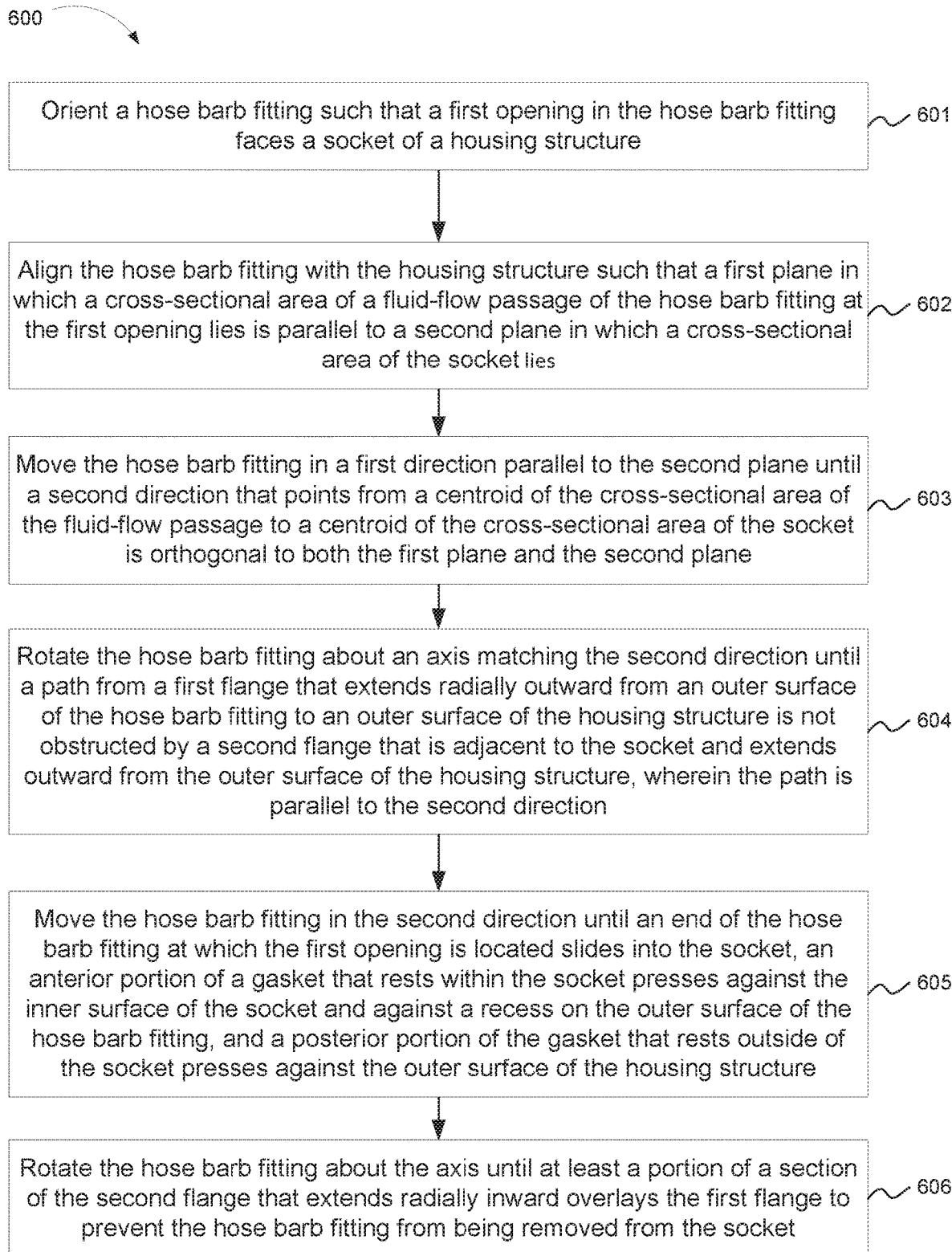
FIG. 6 is a flow diagram illustrating a process for seating a hose barb fitting in a housing structure, according to one example.

FIG. 6 is a flow diagram illustrating a process 600 for seating a hose barb fitting in a housing structure, according to one example. Note that the process 600 may include additional actions not shown in FIG. 6 and the order of the blocks shown may, in some examples, be rearranged. Furthermore, in some examples, some of the blocks shown may be omitted.

As shown in block 601, the process 600 may include orienting a hose barb fitting such that a first opening in the hose barb fitting faces a socket of a housing structure.

As shown in block 602, the process 600 may include aligning the hose barb fitting with the housing structure such that a first plane in which a cross-sectional area of a fluid-flow passage of the hose barb fitting at the first opening lies is parallel to a second plane in which a cross-sectional area of the socket lies.

As shown in block 603, the process 600 may include moving the hose barb fitting in a first direction parallel to the second plane until a second direction that points from a centroid of the cross-sectional area of the fluid-flow passage to a centroid of the cross-sectional area of the socket is orthogonal to both the first plane and the second plane.

As shown in block 604, the process 600 may include rotating the hose barb fitting about an axis matching the second direction until a path from a first flange that extends radially outward from an outer surface of the hose barb fitting to an outer surface of the housing structure is not obstructed by a second flange that is adjacent to the socket and extends outward from the outer surface of the housing structure, wherein the path is parallel to the second direction.

As shown in block 605, the process 600 may include moving the hose barb fitting in the second direction until an end of the hose barb fitting at which the first opening is located slides into the socket, an anterior portion of a gasket that rests within the socket presses against the inner surface of the socket and against a recess on the outer surface of the hose barb fitting, and a posterior portion of the gasket that rests outside of the socket presses against the outer surface of the housing structure; and As shown in block 606, the process 600 may include rotating the hose barb fitting about the axis until at least a portion of a section of the second flange that extends radially inward overlays the first flange to prevent the hose barb fitting from being removed from the socket.

While the present techniques may be susceptible to various modifications and alternative forms, the embodiments discussed above have been provided as examples only. It is to be understood that the techniques are not intended to be limited to the particular examples disclosed herein. Indeed, the present techniques include all alternatives, modifications, and equivalents falling within the true spirit and scope of the appended claims.

EXAMPLES

The following additional examples are included below to highlight several aspects of the apparatuses described herein. However, the scope of the disclosure is not limited to these additional examples or the other examples described herein.

Example 1 includes an apparatus comprising: a hose barb fitting comprising: a first opening at a first end of the hose barb fitting, a second opening at a second end of the hose barb fitting, a fluid-flow passage that extends through the hose barb fitting from the first opening to the second opening, wherein a ratio of a cross-sectional area of the fluid-flow passage to a cross-sectional area of the hose barb fitting is between 0.4 and 0.7, inclusive, a first flange proximal to the first end of the hose barb fitting, wherein the first flange extends outward from an outer surface of the hose barb fitting, and a recess on the outer surface of the hose barb fitting extending along a cross-sectional outer perimeter of the hose barb fitting, wherein a ratio of a length of the recess in a fluid-flow direction for the first opening to a cross-sectional width of the fluid-flow passage is between 0.5 and 0.9, inclusive; a housing structure comprising: a socket, wherein the first end of the hose barb fitting rests inside the socket when the hose barb fitting is fully seated within the housing structure, and a second flange that engages with the first flange to prevent the first end of the hose barb fitting from exiting the socket when the hose barb fitting is fully seated within the housing structure; and a gasket that rests in the recess on the outer surface of the hose barb fitting when the hose barb fitting is fully seated within the housing structure, the gasket comprising: an anterior portion that rests within the socket and presses radially outward relative to the fluid-flow direction for the first opening against an inner surface of the socket when the hose barb fitting is fully seated within the housing structure, and a posterior portion that rests outside of the socket and presses against an outer surface of the housing structure that is orthogonal to the fluid-flow direction for the first opening when the hose barb fitting is fully seated within the housing structure.

Example 2 includes the apparatus of example 1, wherein the anterior portion of the gasket comprises: a first section having a first outer diameter; and a second section having a second outer diameter, wherein the second outer diameter is larger than the first outer diameter.

Example 3 includes the apparatus of example 2, wherein the gasket further comprises a third section between the first section and the second section, and wherein an outer surface of the third section is chamfered to transition from the first outer diameter to the second outer diameter.

Example 4 includes the apparatus of example 3, wherein: the recess on the outer surface of the hose barb fitting comprises an indentation; and an inner surface of the third section comprises a protuberance that extends radially inward relative to the fluid-flow direction for the first opening, and wherein the protuberance rests in the indentation when the hose barb fitting is fully seated within the housing structure.

Example 5 includes the apparatus of example 1, 2, 3, or 4, wherein the housing structure does not include an aperture configured to have a pin inserted therein.

Example 6 includes the apparatus of example 1, 2, 3, 4, or 5, wherein the ratio of the cross-sectional area of the fluid-flow passage to the cross-sectional area of the hose barb fitting is between 0.5 and 0.6, inclusive.

Example 7 includes the apparatus of example 1, 2, 3, 4, 5, or 6, wherein the ratio of the length of the recess in the fluid-flow direction for the first opening to the cross-sectional width of the fluid-flow passage is between 0.6 and 0.8, inclusive.

Example 8 includes an apparatus comprising: a hose barb fitting comprising: a first opening at a first end of the hose barb fitting, a second opening at a second end of the hose barb fitting, a fluid-flow passage that extends through the hose barb fitting from the first opening to the second opening, wherein a ratio of a cross-sectional area of the fluid-flow passage to a cross-sectional area of the hose barb fitting is between 0.4 and 0.7, inclusive, a first flange proximal to the first end of the hose barb fitting, wherein the first flange extends outward from an outer surface of the hose barb fitting, and a recess on the outer surface of the hose barb fitting extending along a cross-sectional outer perimeter of the hose barb fitting, wherein a ratio of a length of the recess in a fluid-flow direction for the first opening to a cross-sectional width of the fluid-flow passage is between 0.5 and 0.9, inclusive; and a gasket that rests in the recess on the outer surface of the hose barb fitting, the gasket comprising: an anterior portion that is proximal relative to the first opening and presses radially inward on the hose barb fitting relative to the fluid-flow direction for the first opening, wherein subtracting an inner radius of the anterior portion from an outer radius of the anterior portion yields a first difference, and a posterior portion that is distal relative to the first opening, wherein subtracting an inner radius of the posterior portion from an outer radius of the posterior portion yields a second difference that is larger than the first difference.

Example 9 includes the apparatus of example 8, wherein the ratio of the cross-sectional area of the fluid-flow passage to the cross-sectional area of the hose barb fitting is between 0.5 and 0.6, inclusive.

Example 10 includes the apparatus of example 8 or 9, wherein the ratio of the length of the recess in the fluid-flow direction for the first opening to the cross-sectional width of the fluid-flow passage is between 0.6 and 0.8, inclusive.

Example 11 includes the apparatus of example 8, 9, or 10, wherein the anterior portion of the gasket comprises: a first section having a first outer diameter; and a second section having a second outer diameter, wherein the second outer diameter is larger than the first outer diameter.

Example 12 includes the apparatus of example 11, wherein the gasket further comprises a third section between the first section and the second section, and wherein an outer surface of the third section is chamfered to transition from the first outer diameter to the second outer diameter.

Example 13 includes the apparatus of example 12, wherein in inner surface of the third section comprises a protuberance that extends radially inward relative to the fluid-flow direction for the first opening, and wherein the protuberance rests in an indentation in the recess.

Example 14 includes a hose barb fitting comprising: a first opening at a first end of the hose barb fitting; a second opening at a second end of the hose barb fitting; a fluid-flow passage that extends through the hose barb fitting from the first opening to the second opening, wherein a ratio of a cross-sectional area of the fluid-flow passage to a cross-sectional area of the hose barb fitting is between 0.4 and 0.7, inclusive; a flange proximal to the first end of the hose barb fitting, wherein the flange extends outward from an outer surface of the hose barb fitting; and a recess on the outer surface of the hose barb fitting extending along a cross-sectional outer perimeter of the hose barb fitting, wherein a ratio of a length of the recess in a fluid-flow direction for the first opening to a cross-sectional width of the fluid-flow passage is between 0.5 and 0.9, inclusive.

Example 15 includes the hose barb fitting of example 14, wherein the ratio of the cross-sectional area of the fluid-flow passage to the cross-sectional area of the hose barb fitting is between 0.5 and 0.6, inclusive.

Example 16 includes the hose barb fitting of example 14 or 15, wherein the ratio of the length of the recess in the fluid-flow direction for the first opening to the cross-sectional width of the fluid-flow passage is between 0.6 and 0.8, inclusive.

Example 17 includes the hose barb fitting of example 14, 15, or 16, wherein an offset angle between the fluid-flow direction for the first opening and a fluid-flow direction for the second opening is between 80 degrees and 100 degrees, inclusive.

Example 18 includes the hose barb fitting of example 14, 15, 16, or 17, further comprising: a barb proximal to the second opening, wherein the barb extends outward from the outer surface of the hose barb fitting.

Example 19 includes the hose barb fitting of example 14, 15, 16, 17, 18, or 19, further comprising: an additional flange proximal to the first end of the hose barb fitting, wherein the additional flange extends outward from the outer surface of the hose barb fitting.

Example 20 includes the hose barb fitting of example 19, wherein the flange is positioned on a first side of the outer surface of the hose barb fitting and the additional flange is positioned on a second side of the outer surface of the hose barb fitting that is opposite the first side.

Example 21 includes a method for seating a hose barb fitting in a housing structure, the method comprising: orienting a hose barb fitting such that a first opening in the hose barb fitting faces a socket of a housing structure; aligning the hose barb fitting with the housing structure such that a first plane in which a cross-sectional area of a fluid-flow passage of the hose barb fitting at the first opening lies parallel to a second plane in which a cross-sectional area of the socket lies; moving the hose barb fitting in a first direction parallel to the second plane until a second direction that points from a centroid of the cross-sectional area of the fluid-flow passage to a centroid of the cross-sectional area of the socket is orthogonal to both the first plane and the second plane; rotating the hose barb fitting about an axis matching the second direction until a path from a first flange that extends radially outward from an outer surface of the hose barb fitting to an outer surface of the housing structure is not obstructed by a second flange that is adjacent to the socket and extends outward from the outer surface of the housing structure, wherein the path is parallel to the second direction; moving the hose barb fitting in the second direction until an end of the hose barb fitting at which the first opening is located slides into the socket, an anterior portion of a gasket that rests within the socket presses against the inner surface of the socket and against a recess on the outer surface of the hose barb fitting, and a posterior portion of the gasket that rests outside of the socket presses against the outer surface of the housing structure; and rotating the hose barb fitting about the axis until at least a portion of a section of the second flange that extends radially inward overlays the first flange to prevent the hose barb fitting from being removed from the socket.

What is claimed is:

1. An apparatus comprising:
    a hose barb fitting comprising:
        a first opening at a first end of the hose barb fitting,
        a second opening at a second end of the hose barb fitting,
        a fluid-flow passage that extends through the hose barb fitting from the first opening to the second opening, wherein a ratio of a cross-sectional area of the fluid-flow passage to a cross-sectional area of the hose barb fitting is between 0.4 and 0.7, inclusive,
        a first flange proximal to the first end of the hose barb fitting, wherein the first flange extends outward from an outer surface of the hose barb fitting, and
        a recess on the outer surface of the hose barb fitting extending along a cross-sectional outer perimeter of the hose barb fitting, wherein a ratio of a length of the recess in a fluid-flow direction for the first opening to a cross-sectional width of the fluid-flow passage is between 0.5 and 0.9, inclusive;
    a housing structure comprising:
        a socket, wherein the first end of the hose barb fitting rests inside the socket when the hose barb fitting is fully seated within the housing structure, and
        a second flange that engages with the first flange to prevent the first end of the hose barb fitting from exiting the socket when the hose barb fitting is fully seated within the housing structure; and
    a gasket that rests in the recess on the outer surface of the hose barb fitting when the hose barb fitting is fully seated within the housing structure, the gasket comprising:
        an anterior portion that rests within the socket and presses radially outward relative to the fluid-flow direction for the first opening against an inner surface of the socket when the hose barb fitting is fully seated within the housing structure, and
        a posterior portion that rests outside of the socket and presses against an outer surface of the housing structure that is orthogonal to the fluid-flow direction for the first opening when the hose barb fitting is fully seated within the housing structure.

2. The apparatus of claim 1, wherein the anterior portion of the gasket comprises:
    a first section having a first outer diameter; and
    a second section having a second outer diameter, wherein the second outer diameter is larger than the first outer diameter.

3. The apparatus of claim 2, wherein the gasket further comprises a third section between the first section and the second section, and wherein an outer surface of the third section is chamfered to transition from the first outer diameter to the second outer diameter.

4. The apparatus of claim 3, wherein:
the recess on the outer surface of the hose barb fitting comprises an indentation; and
an inner surface of the third section comprises a protuberance that extends radially inward relative to the fluid-flow direction for the first opening, and wherein the protuberance rests in the indentation when the hose barb fitting is fully seated within the housing structure.

5. The apparatus of claim 4, wherein the housing structure does not include an aperture configured to have a pin inserted therein.

6. The apparatus of claim 1, wherein the ratio of the cross-sectional area of the fluid-flow passage to the cross-sectional area of the hose barb fitting is between 0.5 and 0.6, inclusive.

7. The apparatus of claim 1, wherein the ratio of the length of the recess in the fluid-flow direction for the first opening to the cross-sectional width of the fluid-flow passage is between 0.6 and 0.8, inclusive.

8. An apparatus comprising:
a hose barb fitting comprising:
a first opening at a first end of the hose barb fitting,
a second opening at a second end of the hose barb fitting,
a fluid-flow passage that extends through the hose barb fitting from the first opening to the second opening, wherein a ratio of a cross-sectional area of the fluid-flow passage to a cross-sectional area of the hose barb fitting is between 0.4 and 0.7, inclusive,
a first flange proximal to the first end of the hose barb fitting, wherein the first flange extends outward from an outer surface of the hose barb fitting, and
a recess on the outer surface of the hose barb fitting extending along a cross-sectional outer perimeter of the hose barb fitting, wherein a ratio of a length of the recess in a fluid-flow direction for the first opening to a cross-sectional width of the fluid-flow passage is between 0.5 and 0.9, inclusive; and
a gasket that rests in the recess on the outer surface of the hose barb fitting, the gasket comprising:
an anterior portion that is proximal relative to the first opening and presses radially inward on the hose barb fitting relative to the fluid-flow direction for the first opening, wherein subtracting an inner radius of the anterior portion from an outer radius of the anterior portion yields a first difference, and
a posterior portion that is distal relative to the first opening, wherein subtracting an inner radius of the posterior portion from an outer radius of the posterior portion yields a second difference that is larger than the first difference.

9. The apparatus of claim 8, wherein the ratio of the cross-sectional area of the fluid-flow passage to the cross-sectional area of the hose barb fitting is between 0.5 and 0.6, inclusive.

10. The apparatus of claim 8, wherein the ratio of the length of the recess in the fluid-flow direction for the first opening to the cross-sectional width of the fluid-flow passage is between 0.6 and 0.8, inclusive.

11. The apparatus of claim 8, wherein the anterior portion of the gasket comprises:
a first section having a first outer diameter; and
a second section having a second outer diameter, wherein the second outer diameter is larger than the first outer diameter.

12. The apparatus of claim 11, wherein the gasket further comprises a third section between the first section and the second section, and wherein an outer surface of the third section is chamfered to transition from the first outer diameter to the second outer diameter.

13. The apparatus of claim 12, wherein an inner surface of the third section comprises a protuberance that extends radially inward relative to the fluid-flow direction for the first opening, and wherein the protuberance rests in an indentation in the recess.

14. A hose barb fitting comprising:
a first opening at a first end of the hose barb fitting;
a second opening at a second end of the hose barb fitting;
a fluid-flow passage that extends through the hose barb fitting from the first opening to the second opening, wherein a ratio of a cross-sectional area of the fluid-flow passage to a cross-sectional area of the hose barb fitting is between 0.4 and 0.7, inclusive;
a flange proximal to the first end of the hose barb fitting, wherein the flange extends outward from an outer surface of the hose barb fitting; and
a recess on the outer surface of the hose barb fitting extending along a cross-sectional outer perimeter of the hose barb fitting, wherein a ratio of a length of the recess in a fluid-flow direction for the first opening to a cross-sectional width of the fluid-flow passage is between 0.5 and 0.9, inclusive.

15. The hose barb fitting of claim 14, wherein the ratio of the cross-sectional area of the fluid-flow passage to the cross-sectional area of the hose barb fitting is between 0.5 and 0.6, inclusive.

16. The hose barb fitting of claim 14, wherein the ratio of the length of the recess in the fluid-flow direction for the first opening to the cross-sectional width of the fluid-flow passage is between 0.6 and 0.8, inclusive.

17. The hose barb fitting of claim 14, wherein the recess comprises an indentation.

18. The hose barb fitting of claim 14, further comprising:
a barb proximal to the second opening, wherein the barb extends outward from the outer surface of the hose barb fitting.

19. The hose barb fitting of claim 14, further comprising:
an additional flange proximal to the first end of the hose barb fitting, wherein the additional flange extends outward from the outer surface of the hose barb fitting.

20. The hose barb fitting of claim 19, wherein the flange is positioned on a first side of the outer surface of the hose barb fitting and the additional flange is positioned on a second side of the outer surface of the hose barb fitting that is opposite the first side.

* * * * *